United States Patent
Yoshii et al.

(10) Patent No.: US 7,584,853 B2
(45) Date of Patent: Sep. 8, 2009

(54) ELECTRONIC COMPONENT SERIES

(75) Inventors: Akitoshi Yoshii, Yurihonjou (JP);
Taisuke Ahiko, Nikaho (JP); Tooru Suda, Nikaho (JP); Tsuyoshi Takashima, Nikaho (JP); Yasushi Izumibe, Nikaho (JP)

(73) Assignee: TDK Corporation, Tokyo (JP)

( * ) Notice: Subject to any disclaimer, the term of this patent is extended or adjusted under 35 U.S.C. 154(b) by 538 days.

(21) Appl. No.: 11/313,620

(22) Filed: Dec. 22, 2005

(65) Prior Publication Data

US 2006/0138019 A1   Jun. 29, 2006

(30) Foreign Application Priority Data

Dec. 27, 2004  (JP)  .............................. 2004-377786

(51) Int. Cl.
*B65D 85/00* (2006.01)
(52) U.S. Cl. ........................ 206/714; 206/725; 206/713; 206/813
(58) Field of Classification Search ................. 206/320, 206/713–717, 813, 725; 428/344, 354, 323
See application file for complete search history.

(56) References Cited

U.S. PATENT DOCUMENTS

| | | | | |
|---|---|---|---|---|
| 4,702,370 A | * | 10/1987 | Honda | 206/714 |
| 4,966,281 A | * | 10/1990 | Kawanishi et al. | 206/714 |
| 5,203,143 A | * | 4/1993 | Gutentag | 53/452 |
| 5,242,725 A | * | 9/1993 | Weissmann et al. | 428/323 |
| 5,361,901 A | * | 11/1994 | Schenz et al. | 206/714 |
| 5,472,085 A | * | 12/1995 | Gelzer | 206/714 |
| 5,524,765 A | * | 6/1996 | Gutentag | 206/713 |
| 5,765,692 A | * | 6/1998 | Schenz | 206/713 |
| 5,857,572 A | * | 1/1999 | Bird et al. | 206/713 |
| 5,960,961 A | * | 10/1999 | Gutentag | 206/714 |
| 6,003,676 A | * | 12/1999 | Beyer | 206/714 |
| 6,102,210 A | * | 8/2000 | Mikami | 206/714 |
| 6,224,975 B1 | * | 5/2001 | Wang | 428/354 |
| 6,357,594 B1 | | 3/2002 | Gutentag | |
| 6,609,009 B1 | * | 8/2003 | Kiyosue et al. | 455/550.1 |
| 6,998,175 B2 | * | 2/2006 | Murata et al. | 428/354 |
| 2003/0180531 A1 | * | 9/2003 | Husemann et al. | 428/354 |
| 2004/0011700 A1 | * | 1/2004 | Brahmbhatt et al. | 206/713 |
| 2004/0124119 A1 | | 7/2004 | Ahn et al. | |
| 2005/0145408 A1 | * | 7/2005 | Hess | 174/52.1 |

FOREIGN PATENT DOCUMENTS

JP  A-2001-163305  6/2001
JP  A 2002-145381  5/2002

* cited by examiner

*Primary Examiner*—J. Gregory Pickett
*Assistant Examiner*—Andrew Perreault
(74) *Attorney, Agent, or Firm*—Oliff & Berridge, PLC

(57) ABSTRACT

The present invention is an electronic component series, comprising a carrier tape which has a plurality of storage recesses cyclically arranged along the longitudinal direction, electronic components to be stored in the plurality of storage recesses, a cover tape established to cover the plurality of storage recesses of the carrier tape, and a pair of adhesive regions which adhere to the carrier tape and to the cover tape, and extend along the longitudinal direction of the carrier tape so as to enclose the plurality of storage recesses from both sides, wherein the adhesive width of the pair of adhesive regions is cyclically increased in size corresponding to the storage recesses respectively. With this electronic component series, the difference in the peel strength of the cover tape between the first adhesive regions and the second adhesive regions can be sufficiently reduced.

6 Claims, 5 Drawing Sheets

(a)

(b)

ELECTRONIC COMPONENT SERIES

BACKGROUND OF THE INVENTION

1. Field of the Invention

The present invention relates to an electronic component series which stores a plurality of electronic components.

2. Related Background Art

Electronic component series are known for storing a plurality of electronic components. These electronic component series are comprising a carrier tape which has a plurality of storage recesses cyclically arranged along the longitudinal direction, various electronic components which are stored in the plurality of storage recesses, a cover tape established to cover the plurality of storage recesses of the carrier tape, and a pair of adhesive regions which adhere to the carrier tape and the cover tape.

A commonly known conventional electronic component series is presented in Japanese Patent Application Laid Open No. 2001-163305. The electronic component series shown in this reference has a pair of rail-like adhesive regions which extend so as to enclose the plurality of storage recesses between the carrier tape and the cover tape.

SUMMARY OF THE INVENTION

However, with the electronic series shown in the aforementioned reference, the carrier tape is strongly vibrated when the cover tape is peeled off of the carrier tape, and the electronic components will be vibrated and tilted or may even be scattered from the storage recesses by this strong vibration. Therefore, when the cover tape is peeled off of the carrier tape and the electronic components in the storage recesses are quickly removed by attaching or the like, mounting of the electronic components onto a circuit board or the like will not proceed smoothly, and the mounting efficiency may be poor.

With the foregoing in view, an object of the present invention is to provide an electronic component series which can sufficiently suppress vibration of the electronic components when the cover tape is peeled from the carrier tape.

As result of diligent research to resolve these problems, the present researchers have discovered that, with the peel strength of the cover tape in the vicinity of storage recesses being significantly lower than that in regions between the storage recesses, a factor for strong vibration of the electronic components, when peeling the cover tape from the carrier tape, is the large difference between the peel strength of the cover tape in the storage recesses regions and the peel strength of the cover tape in the regions between the storage recesses. Furthermore, as a result of further diligent investigations, the present inventors have achieved the present invention.

In other words, the present invention is an electronic component series, comprising a carrier tape which has a plurality of storage recesses cyclically arranged along the longitudinal direction, electronic components to be stored respectively in the plurality of storage recesses, a cover tape provided to cover the plurality of storage recesses of the carrier tape, and a pair of adhesive regions which adhere to the carrier tape and to the cover tape and extend along the longitudinal direction of the carrier tape so as to enclose the plurality of storage recesses from both ends, wherein an adhesive width of at least one of the pair of adhesive regions is cyclically increased in size corresponding to the plurality of storage recesses respectively.

With this electronic component series, at least one of the pair of adhesive regions has an adhesive width which cyclically increases in size depending on the corresponding storage recess. Therefore, the peel strength of the cover tape in the first adhesive regions can be sufficiently increased so that the difference between the peel strength of the cover tape in the first adhesive regions and the peel strength of the cover tape in the second adhesive regions can be sufficiently reduced. Therefore, when the cover tape is peeled from a carrier tape, vibration occurring in the storage recesses of the carrier tape can be suppress and vibration of the electronic components can also be suppressed.

With this electronic component series, at least one of the pair of adhesive regions has a plurality of first adhesive regions cyclically established corresponding to plurality of the storage recesses respectively, and second adhesive regions established between the plurality of first adhesive regions. The adhesive area of the first adhesive regions is preferably larger than the adhesive area of the second adhesive regions. In this case, the difference between the peel strength of the cover tape in the first adhesive region and the peel strength of the cover tape in the second adhesive region can be sufficiently reduced. Therefore, vibration which occurs in the storage recesses of the carrier tape when the cover tape is peeled off of the carrier tape can be more sufficiently suppressed, and vibration of the electronic components can also be more sufficiently suppressed.

The ratio between the adhesive area of the first adhesive regions and the adhesive area of the second adhesive regions is preferably 0.6 or less for this electronic component series.

In this case, vibration of the electronic components while peeling the cover tape from the carrier tape can be very effectively suppressed as compared to the case where the ratio between the adhesive area of the first adhesive regions and the adhesive area of the second adhesive regions is greater than 0.6.

The electronic component series is particularly effective for electronic components which have a length of 0.6 mm or less, a width of 0.3 mm or less, and a height of 0.3 mm or less. This is because tilting of the electronic components and scattering of the electronic components from the storage recesses because of vibration of the electronic components in the storage recesses is particularly a problem when electronic components of this size are stored in an electronic component series.

With the electronic component series of the present invention, vibration of the electronic components can be suppressed when peeling the cover tape from the carrier tape.

DESCRIPTION OF TEE PREFERRED EMBODIMENTS

Figure 1:
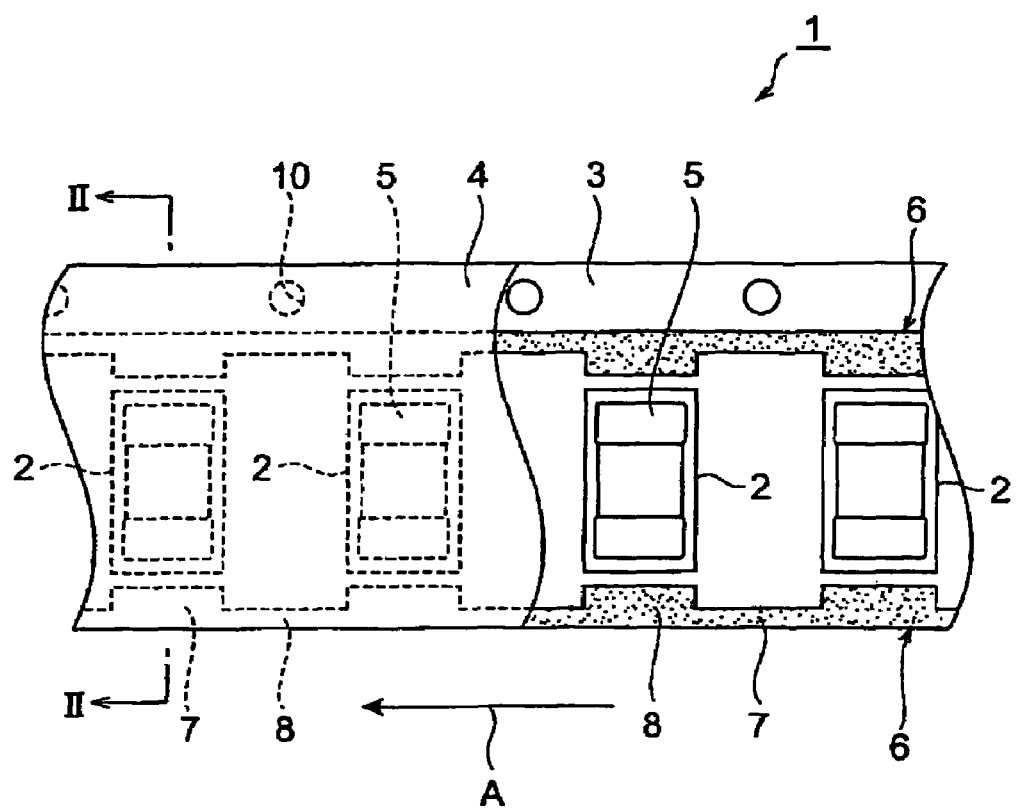
FIG. 1 is a partial cutaway top view diagram showing an embodiment of the electronic component series of the present invention.

Preferred embodiments of the electronic component series of the present invention will be described in detail while referring to the drawings. Incidentally, component elements which are identical or similar have been assigned the same codes, and a redundant description has been omitted.

Figure 2:
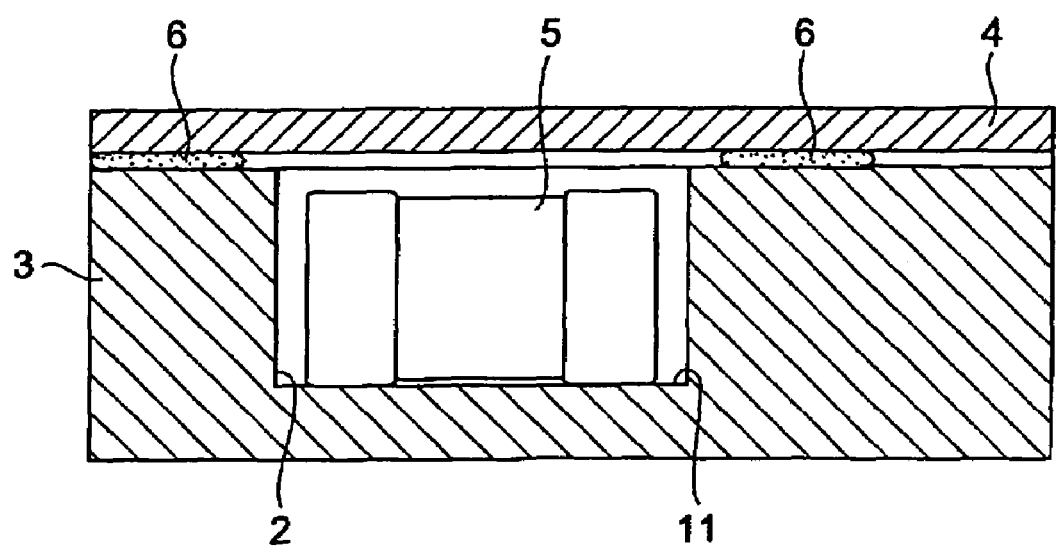
FIG. 2 is a cross section diagram along line II-II of FIG. 1.

FIG. 1 is a partial cutaway top view diagram showing an embodiment of the electronic component series of the present invention, and FIG. 2 is a cross section diagram along line II-II in FIG. 1. As shown in FIG. 1, the electronic component series 1 is comprising a carrier tape 3, and a plurality of storage recesses 2 for storing electronic components 5 are formed on one side of the carrier tape 3 along the longitudinal direction A of the carrier tape 3. The plurality of storage recesses 2 are cyclically formed in the carrier tape 3 at fixed intervals.

A cover tape 4 is established on one side of the carrier tape 3 so as to cover the plurality of storage recesses 2 in the carrier tape 3. Furthermore, electronic components 5 are stored in each of the plurality of storage recesses 2 (Refer to FIG. 2). Incidentally, the carrier tape 3 is manufactured for instance by pressing working a laminate paper. In other words, the storage recesses 2 are formed in the laminate paper by pressing working in order to obtain the carrier tape 3. Furthermore, feed holes 10 which mate with a sprocket in a mounting device or the like are formed in the carrier tape 3, and when the electronic component series 1 is inserted into a mounting device or the like, the electronic component series 1 can be fed in a fixed direction by mating the sprocket with the feed holes 10.

Furthermore, the carrier tape 3 and the cover tape 4 are bonded by a pair of adhesive regions 6, and the pair of adhesive regions 6 extend to enclose the plurality of storage recesses 2 along the longitudinal direction A of the carrier tape 3.

As shown in FIG. 1, the adhesive regions 6 have a plurality of strip-shaped first adhesive regions 7, and the plurality of first adhesive regions 7 are established in a location opposite to the storage recesses 2. In detail, the first adhesive regions 7 have the same length as the storage recesses 2 along the longitudinal direction A of the carrier tape 3, and the first adhesive regions 7 and the storage recesses 2 are positioned so as to not be mutually misaligned along the longitudinal direction A. On the other hand, the storage recesses 2 are positioned between opposing second adhesive regions 7. Furthermore, strip-shaped second adhesive regions 8 are established between the plurality of first adhesive regions 7. In other words, the plurality of first adhesive regions 7 are cyclically established corresponding to the plurality of storage recesses 2.

Figure 3:
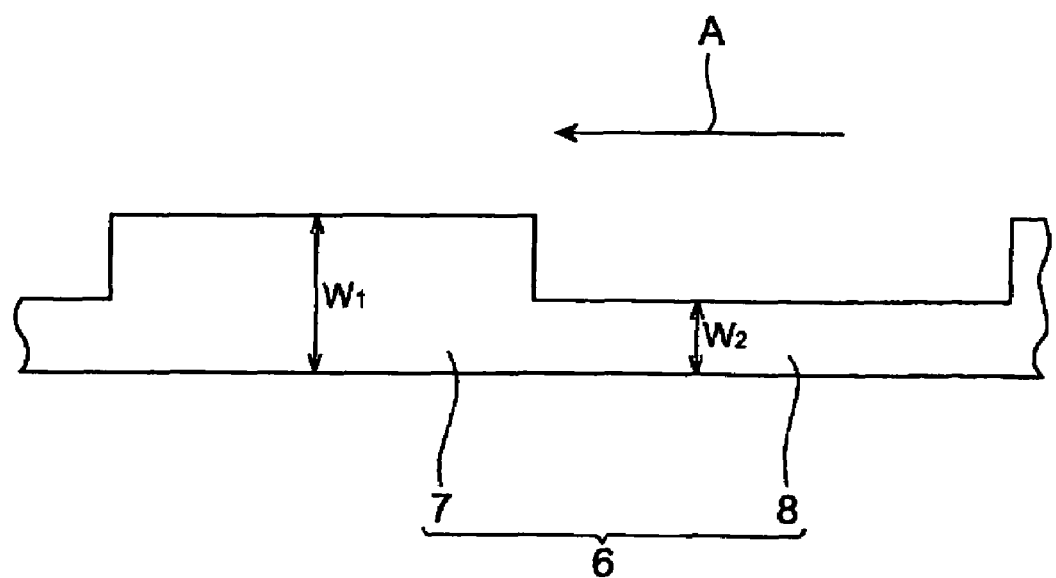
FIG. 3 is a partial top view diagram showing an enlargement of the adhesive region of FIG. 1.

Furthermore, as shown in FIG. 3, the adhesive width W1 of the first adhesive regions 7 and the adhesive width W2 of the second adhesive regions 8 are fixed in the longitudinal direction A of the carrier tape 3, and the adhesive width W1 of the first adhesive regions 7 is larger than the adhesive width W2 of the second adhesive regions 8. In other words, the adhesive width of the adhesive region 6 is cyclically larger corresponding to each of the plurality of storage recesses 2.

Incidentally, the first adhesive regions 7 and the second adhesive regions 8 are integrated together, and the adhesive region 6 extends continuously along the longitudinal direction A. The first adhesive regions 7 and the second adhesive regions 8 are normally formed from the same material. In this case, the material which forms the first adhesive regions 7 and the second adhesive regions 8 is preferably a thermoplastic resin such as polyethylene terephthalate or acrylic resin or the like.

Next, the function of the electronic component series 1 will be described.

First, the electronic component series 1 is placed on a support table (not shown in the drawings) on the mounting device. A sprocket of the mounting device will then mate with the feed holes 10 of the electronic component series 1 and move the electronic component series 1 in a fixed direction. At this time, the cover tape 4 will successively be peeled from one end of the carrier tape 3 with the carrier tape in a fixed condition, the electronic components 5 which are stored in the storage recesses 2 are successively attached to the attach nozzle which is part of the mounting device, and the attached electronic component 5 is then mounted on a circuit board or the like.

At this time, in the pair of adhesive regions 6, the adhesive width W1 of the first adhesive regions 7 is wider than the adhesive width W2 of the second adhesive regions 8. In other words, the adhesive width of the adhesive region 6 cyclically increases in size corresponding to each of the plurality of storage recesses 2. Therefore, the peel strength of the cover tape 4 in the first adhesive regions 7 can be sufficiently larger, and the difference between the peel strength of the cover tape 4 in the first adhesive regions 7 and the peeled strength of the cover tape 4 in the second adhesive regions 8 can be sufficiently reduced. Therefore, when the cover tape 4 is peeled off of the carrier tape 3, vibration occurring in the storage recesses 2 of the carrier tape 3 can be suppressed, and vibration of the electronic components 5 can also be suppressed. Therefore, when the cover tape 4 is peeled from the carrier tape 3 and the electronic components 5 in the storage recesses 2 are rapidly removed by attaching, mounting to the circuit board or the like can proceed smoothly, and the mounting efficiency can be increased.

Figure 4:
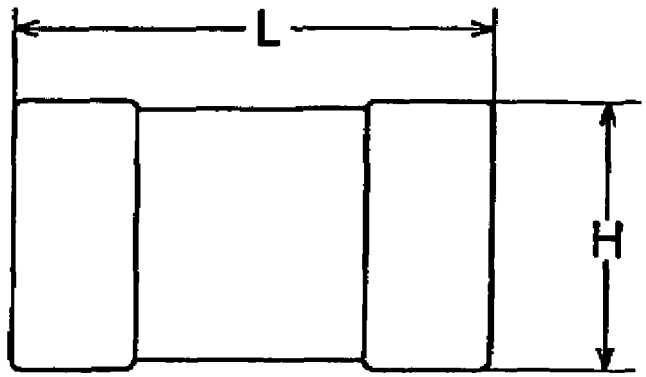
FIG. 4 is a diagram showing an example of an electronic component which is stored in the electronic component series of the present invention, wherein (a) is a front view of the electronic component, and (b) is a top view of the electronic component.
Figure 4:
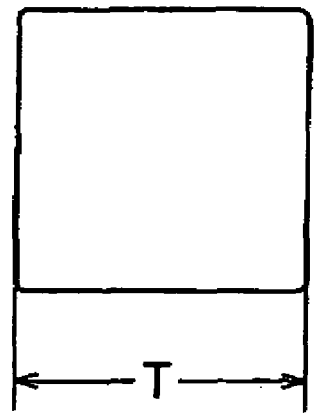

As shown in FIGS. 4 (a), (b), the electronic component series 1 is particularly effective for storing electronic components 5 which have a length L of 0.6 mm or less, a width T of 0.3 mm or less, and a height H of 0.3 mm or less. This is because tilting of the electronic components 5 and scattering of the electronic components 5 from the storage recesses 2 because of vibration of the electronic components 5 in the storage recesses 2 is particularly a problem when the electronic components 5 stored in an electronic component series 1 are of this size.

With the electronic component series 1, the adhesive surface of the first adhesive regions 7 are preferably larger than the adhesive area of the second adhesive regions 8.

In this case, the difference between the peel strength of the cover tape 4 in the second adhesive regions 8 and the peel strength of the cover tape 4 in the first adhesive regions 7 can be sufficiently small. Therefore, when the cover tape 4 is peeled from the carrier tape 3, vibration in the storage recesses 2 of the carrier tape 3 can be more sufficiently suppressed, and the vibration of the electronic components 5 can be more sufficiently suppressed.

At this time, the ratio of the adhesive area of the first adhesive region 7 to the adhesive area of the second adhesive regions 8 is preferably 0.6 or less.

In this case, vibration of the electronic components 5 when peeling the cover tape 4 from the carrier tape 3 can be more sufficiently suppressed than when the ratio of the adhesive area of the first adhesive regions 7 to the adhesive area of the second adhesive regions 8 is greater than 0.6.

The present invention is not restricted to the aforementioned embodiment. For instance, in the aforementioned embodiment, both of the pair of adhesive regions 6 have first adhesive regions 7 and second adhesive regions 8, but it is also acceptable for only one of the pair of adhesive regions 6 to have a plurality of first adhesive regions 7 and second adhesive regions 8.

Figure 5:
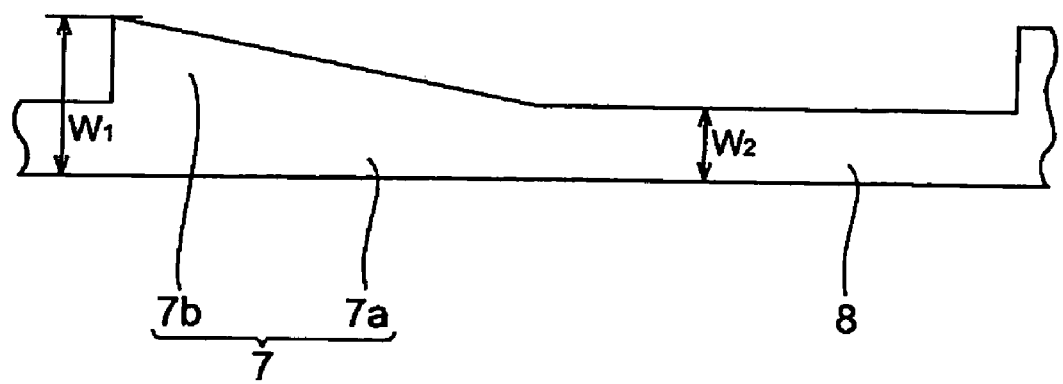
FIG. 5 is a partial top view diagram of an alternate adhesive region for the electronic component series of the present invention.

Furthermore, with the aforementioned embodiment, the first adhesive region 7 has a strip configuration, but is not restricted to having a strip configuration. For instance, the first adhesive regions 7 may also have a configuration which changes adhesive width along the longitudinal direction A such as a trapezoidal configuration. In this case, as shown in FIG. 5, the first adhesive regions 7 will comprise a strip region 7a which has an adhesive width equal to that of the second adhesive regions 8 and a triangular protruding region 7b which protrudes toward the storage recesses 2 side of the strip region 7a. In this case, peeling the cover tape 4 from the side of the first adhesive regions 7 with a wide adhesive width, toward the side of the region with the narrow adhesive width is effective for suppressing vibration of the electronic components 5.

Furthermore, with the aforementioned embodiment, the first adhesive regions 7 are established to not be misaligned in the longitudinal direction A with regards to the storage recesses 2, but misalignment to the storage recesses 2 may be permitted so long as at least a part of the first adhesive regions 7 are opposite the storage recesses 2.

Furthermore, with the aforementioned embodiment, the construction of the carrier tape 3 is not restricted to the aforementioned construction, so long as the carrier tape 3 has a plurality of storage recesses 2 which store electronic components 5 in the longitudinal direction A of the carrier tape 3. For instance, the carrier tape 3 may have a plurality of storage recesses formed along the longitudinal direction by embossing a tape-like member.

The details of the present invention will be described below in further detail by presenting embodiments and comparison examples, but the present invention is not restricted to the following embodiments.

Embodiments 1 Through 5

A laminate paper was prepared for use as the carrier tape. Press working of this laminate paper was performed in order to form a plurality of storage recesses in the longitudinal direction. At this time, the plurality of storage recesses were cyclically formed at a fixed interval. The size of the storage recess was 680 μm×380 μm×350 μm.

Next, C0603 size multilayer capacitors were stored as the electronic components in each of the storage recesses of the carrier tape.

On the other hand, a polyester cover tape (width 5.25 mm, thickness 0.053 mm) was prepared by coating the whole surface of one side with an acrylic type adhesive.

Next, the cover tape was placed over the surface of the carrier tape where the plurality of storage recesses were formed, with the surface where the adhesive was applied facing the carrier tape.

Next, a beating roller (width 0.5 mm) was brought into contact with the surface of the cover tape in a position to enclose the storage recesses in the longitudinal direction of the carrier tape, and then the cover tape was moved. At this time, the temperature of the heating roller was between 180 and 200° C. In this manner, the carrier tape and the cover tape were bonded, and a pair of adhesive regions were formed at a position which encloses the plurality of storage recesses along the longitudinal direction of the carrier tape.

Next a rectangular heating surface of a soldering iron was brought in contact with each position which encloses the storage recesses in the longitudinal direction of the carrier tape to form the first adhesive regions at each location which encloses the storage recesses, and thereby adhesive regions, comprising a first adhesive region and a second adhesive region with a smaller adhesive width than the first adhesive region, were obtained. Embodiments 1 through 5 of the electronic component series were obtained in this manner. At this time, the size of the heating surface was varied for each embodiment, and the ratio of the adhesive area of the first adhesive regions (S1) to the adhesive area of the second adhesive regions (S2) was as shown below in Table 1.

TABLE 1

|  | Electronic Component Size | Adhesive Area Ratio (S1/S2) | Mounting Test (Attachment Rate: %) |
|---|---|---|---|
| Embodiment 1 | C0603 | 0.8 | 99.78 |
| Embodiment 2 | C0603 | 0.6 | 99.92 |
| Embodiment 3 | C0603 | 0.4 | 99.95 |
| Embodiment 4 | C0603 | 0.2 | 99.99 |
| Embodiment 5 | C0603 | 0.17 | 99.99 |
| Comparison 1 | C0603 | 1 | 99.45 |
| Embodiment 6 | C0402 | 0.8 | 98.97 |
| Embodiment 7 | C0402 | 0.6 | 99.94 |
| Embodiment 8 | C0402 | 0.4 | 99.98 |
| Embodiment 9 | C0402 | 0.2 | 99.97 |
| Embodiment 10 | C0402 | 0.17 | 99.98 |
| Comparison 2 | C0402 | 1 | 98.44 |

Furthermore, the cover tape was peeled off of the electronic component series of embodiments 1 through 5, and the electronic components were attached at a speed of 10 components per second, and the attached rate was measured based on the following equation:

Attachment rate (%)=100×(number of electronic components actually attached/number of electronic components attempted)

The results are shown in Table 1.

(Comparison 1)

An electronic component series was manufactured in an identical manner to embodiment 1, except that the first adhesive regions were not formed at each position which encloses the storage recesses. The attachment rate for the electronic component series obtained in this manner was calculated in the same manner as for embodiment 1. The results are shown in Table 1.

Embodiments 6 Through 10

Electronic component series were manufactured to be identical to embodiment 1 except that the electronic components were replaced with C0402 size electronic components and the size of the storage recess was 450 μm×250 μm×240 μm. The attachment rate for the electronic component series obtained in this manner was calculated in the same manner as for embodiment 1. The results are shown in Table 1.

(Comparison 2)

An electronic component series was manufactured to be identical to comparison 1 except that the electronic components were replaced with C0402 size electronic components and the size of the storage recess was 450 μm×250 μm×240 μm. The attachment rate for the electronic component series obtained in this manner was calculated in the same manner as for embodiment 1. The results are shown in Table 1.

From the results shown in Table 1, the electronic component series of embodiments 1 through 5 were found to have sufficiently higher attachment rates than the electronic component series of comparison 1. In particular, the electronic component series of embodiments 2 through 5 which had an adhesive area ratio of 0.6 or less were found to have even higher attachment rates than the electronic component series of embodiment 1 which had an adhesive area ratio of 0.8. Incidentally, in Table 1, the acceptable range for attachment rates in the mounting test for the electronic components which have a C0603 size was 99.50% or higher.

Furthermore, the electronic component series of embodiments 6 through 10 were also found to have sufficiently higher attachment rates than the electronic component series of comparison 2. In particular, the electronic component series of embodiments 7 through 10 which had an adhesive area ratio of 0.6 or less were found to have even higher attachment rates than the electronic component series of embodiment 6 which had an adhesive area ratio of 0.8. Incidentally, in Table 1, the acceptable range for attachment rates in the mounting test for the electronic components which have a C0402 size was 98.50% or higher.

Therefore, the electronic component series of embodiments 1 through 10 were thought to suppress vibration of the electronic components during peeling of the cover tape from the carrier tape better than the electronic component series of comparison 1 and comparison 2. This effect can be said to be the same even if the size of the electronic components changes.

What is claimed is:

1. An electronic component series, comprising:
   a carrier tape which has a plurality of storage recesses cyclically arranged along the longitudinal direction;
   electronic components to be stored respectively in the plurality of storage recesses;
   a cover tape provided to cover the plurality of storage recesses of the carrier tape; and
   a pair of adhesive regions which adhere to the carrier tape and to the cover tape, and extend along the longitudinal direction of the carrier tape so as to enclose the plurality of storage recesses from both sides;
   wherein an adhesive width of both of the pair of adhesive regions is cyclically increased in size so that an increased width portion corresponds to the length of the storage recesses in the longitudinal direction and a decreased width portion corresponds to the space between the storage recesses.

2. The electronic component series according to claim 1, wherein at least one of the pair of adhesive regions has a plurality of first adhesive regions cyclically established corresponding to the plurality of storage recesses respectively, and second adhesive regions established between the plurality of first adhesive regions, the adhesive area of the first adhesive regions being larger than the adhesive area of the second adhesive regions.

3. The electronic component series according to claim 2, wherein the ratio of the adhesive area of the second adhesive regions compared to the adhesive area of the first adhesive regions is 0.6 or less.

4. The electronic component series according to claim 1, wherein the electronic components have a length of 0.6 mm or less, a width of 0.3 mm or less, and a height of 0.3 mm or less.

5. The electronic component series according to claim 2, wherein the electronic components have a length of 0.6 mm or less, a width of 0.3 mm or less, and a height of 0.3 mm or less.

6. The electronic component series according to claim 3, wherein the electronic components have a length of 0.6 mm or less, a width of 0.3 mm or less, and a height of 0.3 mm or less.

* * * * *